United States Patent
Wilkie

(10) Patent No.: US 7,736,723 B2
(45) Date of Patent: Jun. 15, 2010

(54) HOLOGRAPHIC FILMS EMPLOYING CYCLOOLEFIN COPOLYMERS

(75) Inventor: Andrew F. Wilkie, Avondale, PA (US)

(73) Assignee: Applied Extrusion Technologies, Inc., New Castle, DE (US)

( * ) Notice: Subject to any disclaimer, the term of this patent is extended or adjusted under 35 U.S.C. 154(b) by 174 days.

(21) Appl. No.: 11/949,422

(22) Filed: Dec. 3, 2007

(65) Prior Publication Data

US 2009/0142612 A1 Jun. 4, 2009

(51) Int. Cl.
*B32B 3/00* (2006.01)
*G03F 7/00* (2006.01)

(52) U.S. Cl. .............................. 428/172; 430/1; 430/2; 283/86

(58) Field of Classification Search ................. 428/172, 428/520, 522; 430/1, 2; 359/1, 2; 283/86
See application file for complete search history.

(56) References Cited

U.S. PATENT DOCUMENTS

| | | | |
|---|---|---|---|
| 2,721,189 | A | 12/1955 | Anderson et al. |
| 6,472,031 | B1 | 10/2002 | Daecher et al. |
| 6,558,788 | B1 | 5/2003 | Butler et al. |
| 6,677,029 | B2 | 1/2004 | Wilkie |
| 6,808,658 | B2 | 10/2004 | Stover |
| 6,827,886 | B2 | 12/2004 | Neavin et al. |
| 6,830,713 | B2 | 12/2004 | Hebrink et al. |
| 6,852,407 | B2 | 2/2005 | Yasue |
| 2003/0035972 | A1 | 2/2003 | Hanson et al. |
| 2005/0078366 | A1 | 4/2005 | Takahashi et al. |
| 2005/0105150 | A1* | 5/2005 | Raguin .................... 359/15 |
| 2005/0238830 | A1 | 10/2005 | Karsten et al. |
| 2005/0244614 | A1 | 11/2005 | Bharadwaj et al. |
| 2006/0013984 | A1 | 1/2006 | Sandell et al. |
| 2006/0127623 | A1 | 6/2006 | Ishida |
| 2006/0257594 | A1 | 11/2006 | Haas et al. |
| 2008/0152875 | A1* | 6/2008 | Tomita et al. ............ 428/195.1 |

FOREIGN PATENT DOCUMENTS

CA        2378696        6/2005
WO    2006095902 A1    9/2006

OTHER PUBLICATIONS

Beer et al., Extruding COC Film Without Fisheyes, Offprint of Plastics Special Jun. 1999.
Topas Cyclic Olefin Copolymer (COC) Product Manual, Mar. 2006.
Shin et al., Chemical Structure and Physical Properties of Cyclic Olefin Copolymers, Pure Appl. Chem. vol. 77/5, 801-814, IUPAC 2005.

* cited by examiner

*Primary Examiner*—Donald Loney
(74) *Attorney, Agent, or Firm*—Caesar, Rivise, Bernstein, Cohen & Pokotilow, Ltd.

(57) ABSTRACT

A multilayer holographic film includes a first layer and an embossed layer on at least one side of the first layer and having a micro-embossed holographic image therein. The embossed layer is thinner than the first layer and has a lower embossing temperature than the first layer. The hologram-receiving layer with a micro-embossed holographic image embossed therein is adapted to receive a metal layer thereon, if desired, and the layer includes a cycloolefin copolymer as the primary polymer component.

20 Claims, No Drawings

HOLOGRAPHIC FILMS EMPLOYING CYCLOOLEFIN COPOLYMERS

BACKGROUND OF THE INVENTION

1. Field of Invention

This invention relates to holographic films, both metallized and non-metallized, employing cycloolefin copolymers (COC), and in particular to unique multilayer holographic films that include a holographic image in the COC layer, in the form of a micro-embossed image.

2. Background Art

Holographic films, both metallized and non-metallized, are known in the art, and are utilized for a wide variety of applications, e.g., in flexible packaging as substrates for food products, as gift wrapping paper and as a decorative component in non-flexible packages or rigid packages, e.g., packages for tubes of toothpaste, cereal boxes, detergent boxes, etc. For some applications, and in particular in the packaging of food products, it is desirable that these holographic films have good oxygen and water vapor barrier properties. Although some non-metallized holographic films may have reasonably good oxygen and water vapor barrier properties, the primary function of the micro-embossed holographic image is to impart a decorative appearance to the film. Providing a metallized layer on the micro-embossed holographic image enhances image quality (e.g., brilliance) and also the oxygen and water vapor barrier properties of the holographic films.

Prior art multilayer holographic films have been made both by coextrusion and coating processes.

Prior art coextruded films have employed semi-crystalline copolymers to form the outer layer for receiving a micro-embossed holographic image therein. Specifically these semi-crystalline outer layers have included Ziegler-Natta catalyzed propylene-ethylene copolymer (3-7% ethylene) layers or propylene-butene copolymer layers. A coextruded holographic film including a propylene-butene hologram receiving layer, which was invented by Andrew F. Wilkie, the inventor herein, and is covered in U.S. Pat. No. 6,677,029, has a higher gloss and more brilliant holographic image than the holographic films including the above-identified Ziegler-Natta catalyzed propylene-ethylene copolymer.

Although the use of a hologram-receiving layer including a butene-propylene random copolymer provides improved gloss and a more brilliant holographic image than the prior art holographic films employing a propylene-ethylene copolymer layer for receiving the holographic image therein, there is a continuing need for improved holographic films having even better gloss and brilliance.

Prior art holographic films manufactured by a coating process include films having an acrylic (amorphous) hologram-receiving layer provided on a polypropylene or polyester core. These acrylic coatings generally are applied off-line after fabrication of the base film. Interestingly, although the unembossed acrylic coating has a gloss that is higher than the prior art, unembossed propylene-butene copolymer layer, after embossing the coated film is no more brilliant than the film including the embossed, propylene-butene copolymer layer. Thus, it is not predictable that starting with a higher gloss, unembossed film will necessarily result in a corresponding increase in the brilliance of the film after the film has been micro-embossed to provide a holographic image therein.

Although an outer layer formed of 100% Ziegler-Natta catalyzed or metallocene catalyzed isotactic polypropylene homopolymer has the desired gloss (e.g., on the order of 135 or higher gloss units as measured at a 20° angle employing ASTM D2457-97) these polymers have an embossing temperature that is too high to permit their effective use in the holographic films of this invention.

Cyclic-olefin copolymers (sometimes referred to as "COC"), which are employed in the unique and unobvious holographic films of this invention, have been known since approximately 1954 (DuPont, U.S. Pat. No. 2,721,189). These cyclic-olefin copolymers have been employed to make amorphous, plastic based products. In particular, due to the clarity of the COC plastics, they typically have been used in lenses for cameras, copiers, CD players, prefillable syringes and small vials produced by an injection molding operation followed by stretch blow molding.

It also has been suggested to form biaxially oriented films of COC for use as food wrapping, such as twist wrappers for candy.

It also has been recognized that films formed from COC can be metallized for use in electrical applications, such as for capacitor films.

Although COC has been available for use in making plastic films for several years, there has been absolutely no recognition that COC can be employed as a plastic layer in a multilayer holographic film, wherein the COC layer is required to receive and retain a micro-embossed image therein. Nor has there been any recognition of metallizing a COC micro-embossed layer to enhance the brilliance, or clarity of the micro-embossed image and improve the oxygen and water vapor barrier properties of such film. Stating this another way, there has been absolutely no recognition in the prior art that COC can be employed to form a hologram-receiving layer that has the capability of both receiving and retaining a micro-embossed image therein, and thereafter, if desired being metallizable to enhance the brilliance of the micro-embossed image and improve the oxygen and water vapor barrier properties of the film.

Disclosures of employing COC in a number of different products are included in the following publications:

1. Offprint of Plastic Special 6/1999 titled "Extruding COC without Fish Eyes"
2. U.S. Patent Publication No. 2005/0170124, disclosing a glossy film including a cycloolefin copolymer as a filler in a polyolefin-based resin film.
3. U.S. Patent Publication No. 2004/0018355, disclosing a forgery-preventing film, which preferably is a multilayer structure. Although ethylene-cycloolefin copolymers are generally disclosed as one of numerous types of copolymers that can be used in a first layer of the film, the most preferred polymers are identified as propylene-based resin and high-density polyethylene. Moreover, the only specifically enumerated use for the ethylene-cycloolefin copolymers in the holographic layer is as an organic filler for a thermoplastic polyolefin resin layer, similar to the disclosed use in the above identified '124 patent publication.
4. Other publications of background interest are: U.S. Pat. No. 6,830,713; U.S. Pat. No. 6,852,407; U.S. Patent Publication No. 2006/0013984; U.S. Patent Publication No. 2005/0078366; U.S. Pat. No. 6,808,658; U.S. Pat. No. 6,827,886; *Pure Appli. Chem., Vol.* 77, No. 5, pp. 801-814, 2005, "Chemical Structure and Physical Properties of Cyclic Olefin Copolymers (IUPAC Technical Report), prepared by Ju Young Shin, Ji Wong Park, Chenyang Liu, Jiasong He and Sung Chul Kim; and Topaz Advanced Polymers Technical Publication for Cyclic Olefin Copolymer (COC).

All of the patents and other publications identified herein are incorporated herein by reference in their entireties.

BRIEF SUMMARY OF THE INVENTION

A multilayer holographic film includes a first layer and a hologram-receiving layer on at least one side of the first layer. The hologram-receiving layer is thinner than the first layer and has a lower embossing temperature than the first layer, said hologram-receiving layer including a micro-embossed, holographic image therein. The hologram-receiving layer in the films of this invention, with the micro-embossed image therein, is adapted to receive a metal layer thereon, if desired. In accordance with this invention the hologram-receiving layer includes a cycloolefin copolymer as the primary polymer component and most preferably the polymer component is substantially 100% cycloolefin copolymer. The above-described film including the micro-embossed holographic image in the COC hologram-receiving layer, either with or without a metal layer on the micro-embossed hologram-receiving layer, is within the scope of the present invention.

In the most preferred embodiment of the invention, the cycloolefin copolymer is an ethylene cycloolefin copolymer and most preferably an ethylene-norbornene copolymer In the most preferred embodiment of this invention, the cycloolefin copolymer layer is directly adhered to the first layer, without the use of a separate tie layer.

Most preferably, the first layer includes a hologram-receiving layer on only one side thereof, and the opposite side of the first layer includes either a heat sealable layer or a printable layer thereon. As will be explained in greater detail hereinafter, the present invention relates to a multilayer holographic film including a hologram-receiving layer having a micro-embossed, holographic image therein and, if desired, including an additional layer for enhancing the image quality and/or enhancing the oxygen and water vapor barrier properties of the film. Such an additional layer can include a metal layer, a metal oxide layer, a highly refractive zinc sulfide layer, etc. over the holographic image. The metallized, micro-embossed holographic film also constitutes a part of the present invention.

Reference throughout this application to the holographic image being "micro-embossed," or references of similar import, refers to a pattern wherein the size of the smallest feature (i.e., either the space between changes in surface topography or the depth of the smallest impression) is less than 100 μm and further wherein the depth of the embossed pattern is less than the thickness of the hologram-receiving layer.

It should be understood that nano-embossing, which provides even a smaller pattern than micro-embossing, is considered to be within the definition of "micro-embossed" or "micro-embossing," as these latter terms are employed in this application.

Throughout this specification, unless otherwise specified, the term "polypropylene" means a Ziegler-Natta catalyzed or metallocene catalyzed semi-crystalline (e.g., isotactic) homopolymer of propylene or a copolymer of propylene with another olefin in an amount insufficient to change the semi-crystalline nature of the polypropylene significantly or to change the properties that make polypropylene a desirable packaging material. Typically, the other olefin blended with propylene will be ethylene in an amount not exceeding about 1% by weight in order to constitute a copolymer of propylene within the definition of "polypropylene."

Although holographic transfer films (i.e., films employed to impart a holographic image to a subsequently applied metallized layer that thereafter is transferred to another substrate) are within the scope of the broadest aspects of this invention, the preferred metallized holographic films of this invention include a metal layer that conforms to the embossed pattern in a holographic-receiving layer of the film and also remains a permanent part of that film to form a composite substrate having a variety of different uses, e.g., gift wrapping paper, flexible packaging applications and as a decorative component in non-flexible packages or rigid packages.

DETAILED DESCRIPTION OF THE INVENTION

The most preferred films of this invention are biaxially oriented three-layer products; preferably formed by a conventional co-extrusion process employing either bubble or tenter forming equipment. However, within the broadest aspects of this invention the film can include only two (2) layers or more than three-layers and may be either cast or uniaxially oriented. The core layer of a three component film, which generally is the thickest layer, most preferably is a polypropylene layer, and most preferably is a Ziegler-Natta catalyzed or a metallocene catalyzed isotactic polypropylene homopolymer. However, it should be understood that the use of a polypropylene copolymer (either Ziegler-Natta catalyzed or metallocene catalyzed), either by itself or in conjunction with a polypropylene homopolymer, is within the scope of the broadest aspects of this invention.

It should be understood that reference to "polypropylene copolymers" includes copolymers wherein greater than 1% ethylene, by weight, is employed, as well as blends of polypropylene and a propylene-ethylene copolymer. In accordance with the broadest aspects of this invention, the core layer can be of any acceptable thickness, with the thickness preferably being in the range of 40 to 200 gauge; more preferably in the range of 60 to 120 gauge and even more preferably in the range of 65 to 80 gauge. In an exemplary film of this invention, the core layer has a thickness of approximately 68.5 gauge (3.95 gauge=1 μm).

It is known that the outer layer of a multilayer, holographic film needs to have certain very important properties in order to both receive and retain the holographic image therein and also to provide the desired visual appearance, e.g., brightness and sharpness of image. Specifically, in addition to being capable of receiving and retaining a sharp, micro-embossed image therein, the outer hologram-receiving layer of the film must have a sufficiently high gloss, low haze and degree of clarity to make the film suitable for its intended use. All references to "gloss," "haze" and "clarity" in describing the films of this invention are with reference to a non-metallized film. As noted earlier, this invention contemplates both non-metallized and metallized holographic films. The films of this invention are generally metallized for applications where the brilliance or clarity of the micro-embossed image desirably needs to be enhanced and/or where it is desirable to improve the oxygen and water vapor barrier properties of film.

It has been determined that the high gloss of the hologram-receiving outer layer in the films of this invention prior to embossing translates to a level of brilliance (i.e., brightness) and sharpness, or crispness, of the micro-embossed holographic image that has heretofore been unattainable in holographic films employing a conventional Ziegler-Natta catalyzed ethylene-propylene random copolymer hologram-receiving layer or a butene-propylene random copolymer hologram-receiving layer of the type described in U.S. Pat. No. 6,667,029.

It should be noted that the embossing temperature of the copolymer employed to receive the holographic image therein is critical, in that it defines the temperature range of embossability. Too high an embossing temperature results in a film surface that will not retain a sharp embossed image therein. Too low an embossing temperature results in a surface that will stick to the embossing roll, thereby adversely affecting processability and the quality of the embossed image.

Another important feature of this invention is the thickness of the outerlayer that receives the holographic image therein. In particular, the thickness should be at least as thick, and preferably thicker, than the depth of the micro-embossed pattern formed into the surface thereof.

In prior art, holographic films employing hologram-receiving layers that are semi crystalline, the method of formation requires that the entire film be preheated prior to embossing, and that micro-embossing is provided by a cooled embossing roll. The problem with this technique is that the heating of the whole film can result in an undesirable distortion when under tension during the micro-embossing operation. This distortion occurs in proximity to the embossing nip, either just prior to or just after the nip.

The use of an amorphous polymer or copolymer hologram-receiving layer requires heating only the surface layer to be embossed, which tends to prevent distortion. The net effect of this benefit is that holographic films of this invention can be formed at faster speeds than prior art films wherein the hologram-receiving layer is semi-crystalline.

It also is important to understand that there is no good scientific data or properties of a particular compound or film from which a person skilled in the art can determine, or even speculate whether a layer formed of a specific compound will necessarily be able to receive a micro-embossed pattern therein, let alone retain the micro-embossed pattern therein. In accordance with this invention, applicant has discovered that a cycloolefin copolymer, which is amorphous, (hereinafter sometimes referred to as "COC") can be employed in a coextrusion process to provide a hologram-receiving layer in a multilayer film structure to achieve a level of gloss in the unembossed film and a level of brilliance in the micro-embossed film that has heretofore been unattainable in prior art structures. This was not a predictable result, in view of the fact that amorphous polymers have not be employed as the primary polymer in hologram-receiving layers of coextruded, multi-layer holographic films. As noted above, a coating process, not a co-extrusion process, has been employed to form holographic films with an acrylic polymer, which is amorphous, and that holographic film did not have the high gloss or degree of brilliance achieved in the films of this invention.

Most preferably, the COC employed in the films of this invention is an ethylene cycloolefin copolymer and most preferably is an ethylene-norbornene copolymer sold under the Topas trademark by Topas Advanced Polymers Inc. located at Florence, Ky. USA. As note above, the COC is the primary polymer component in the hologram-receiving layer and most preferably is substantially 100% of the polymer component.

In accordance with an exemplary embodiment of this invention, a multilayer holographic film includes a polypropylene core that can be of any suitable thickness, with the thickness preferably being in the range of 40 to 200 gauge; more preferably in the range of 60 to 120 gauge and even more preferably in the range of 65 to 80 gauge. In an exemplary film of this invention, the core has a thickness of 68.5 gauge.

Adhered to one side of the core layer, as part of a conventional co-extrusion process, is an outer skin layer for receiving the embossed, holographic image therein. In accordance with this invention, the outer, embossable skin layer is COC and more preferably, an ethylene norbornene COC having a thickness generally in the range of 0.1 to 10 gauge, more preferably in excess of 4 gauge and even more preferably in the range of about 6 to 8 gauge.

The most preferred COC is Ticona Topas® COC, having a Tg of 65 to 130° C. The Tg of Topas® COC is determined, or set, by the amount of norbornene comonomer, i.e., the higher the level of norbornene, the higher the Tg. It should be understood that the Tg can be tailored to a specific temperature by blending existing grades of Topas™ Tg=65° C., Topas 9506 Tg=68° C., Topas 8007 Tg=80° C., Topas 5013 Tg=136° C. and Topas 6013 Tg=140° C. Individuals skilled in the art can easily determine the desired blend of the various Topas' products in order to achieve the desired Tg in the embossable skin layer employed in the films of this invention. The lowest acceptable Tg of the COC skin layer is determined by the ability to process the film through the machine direction orientation (MDO) section of a tenter process. The ability to effectively process the film through the MDO section requires that the film be capable of being heated to a temperature that is high enough to permit MD orientation of the film, and yet not so high as to cause the skin layer to stick to the MDO rolls. For example, a COC with a Tg of 65° C. most likely would not be processable because the required MDO temperatures would be much higher than the Tg, e.g., on the order of 100-120° C., and at the required MDO temperatures the COC skin layer most likely would stick to the MDO rolls.

Based on applicant's experience and knowledge, it is believed that in a standard, commercial tenter line the lowest acceptable Tg would be in the neighborhood of >80-90° C. However, in a simultaneous orientation line, e.g., in a tubular or a LISM tenter process, the lowest acceptable Tg is believed to be less of a limitation than in a standard, commercial tenter line. In other words, the lowest acceptable Tg, or range of Tg, is processing equipment dependent. Employing a COC skin layer having a Tg of 130° C. should not present a processing problem for the standard tenter process. However, more heat on the embossing roll would be required; most likely resulting in slower processing speeds as compared to the processing of films having a lower Tg skin.

It should be understood that in a preferred embodiment of this invention, the embossable COC skin layer is directly extruded with the polypropylene core so as to directly adhere to the skin layer to the core without the use of any intermediate tie layer. This is a very desirable benefit of the present invention, since it eliminates the need for additional layers to provide the required bonding stability in the finished product.

The exemplary coextruded structure of this invention includes a coextruded skin layer on the side of the core layer opposite the COC layer. This other layer can be a heat sealable layer, a print bonding layer, or any other type of layer, depending on the intended use of the film.

A heat sealable layer employed on the side of the core layer opposite the COC layer will be of a material so that when heat is applied to affect the seal, the orientation of the core layer will not be disturbed. A commonly used heat seal layer is a terpolymer of propylene, ethylene and butene-1. In general, any of the heteropolymers that are usable in the core layer can be used as sealant layers. In addition, within the broadest aspects of this invention, other heat sealable coating layers may also be employed.

Another commonly used functional layer is a slip layer to facilitate handling of the film during later converting operations. Such a layer is compromised of a polymer containing a (non-migratory) slip agent such as cross-linked polydimethylsiloxanes, e.g., Tospearl® from GE Silicones. A functional layer may also contain an anti-block additive to facilitate unwinding of the film after it has been wound at the end of the film manufacturing process.

Conventional additives, in conventional amounts can be included in the multi-layer films of this invention, provided that no additives should be included that negatively affect the performance of the layer into which it is incorporated or that migrate into another layer and negatively affect the performance of that layer in carrying out its intended function. Suitable conventional additives include anti-oxidants, pigments, orientation stress modifiers, flame retardants, anti-static agents, anti-foggants, and, as stated earlier herein, slip agents.

After the multilayer film is formed, it is processed in a separate, off-line operation in which the holographic layer is micro-embossed. If it is desired to enhance the brilliance (e.g., clarity and sharpness) of the micro-embossed image in the hologram-receiving layer and/or enhance the oxygen and water vapor barrier properties, that layer is oxidatively treated by any acceptable treatment or process, such as corona, flame or plasma treatment, and then metallized, preferably by the vapor deposition of a metal layer on the previously embossed holographic layer, or by the deposition of a clear metal oxide layer or a highly refractive zinc sulfide layer.

Although the holographic receiving layer preferably is oxidatively treated, it has been determined that the COC, in addition to having reflectance properties that are superior to the present state of the art C3C4 layers, do not require a post-oxidative treatment operation to achieve strong adhesion to a metal layer, such as a vacuum deposited aluminum layer. However, in order to assure even stronger adhesion, the hologram-receiving layer can be oxidatively treated, if desired.

The embossed metallized surface of Topas® COC yields extremely bright micro-embossed images and good barrier properties to oxygen and water.

It should be noted that the gloss of the Topas® COC layer at 20° in accordance with ASTMD 2457-97 has been measured as high as 160 to 170 units using a Gardener 20° gloss meter, and this material has been found to be capable of receiving a micro-embossed pattern therein while retaining the sharpness of that pattern and the high gloss of the product.

In comparison, it should be understood that although typical homopolymer polypropylene (melting point of about approximately 158° C. to 163° C.) has a 20° gloss of approximately 140 to 150 gloss units, which is an acceptable gloss, it cannot be effectively micro-embossed by conventional soft embossing because the temperature required to heat this semi-crystalline material up to its embossing temperature causes severe distortion in the body of the polyolefin film.

The present state of the art embossing layer, prior to this invention, is a C3C4 random copolymer with a melting point of about 116° C. to 130° C. As noted earlier, this film is covered in applicant's previously issued U.S. Pat. No. 6,677,029 the subject matter of which already has been incorporated by reference herein.

The 20° gloss of the C3C4 random copolymer resin layer can be as high as 130-135 gloss units. Moreover, this latter resin gives excellent embossing pattern replication. Although polyolefin polymers such as Ziegler-Natta catalyzed propylene ethylene copolymers also can be micro-embossed with good pattern replication, the gloss values achieved in embossable film layers employing these latter formulations generally are less than 130 gloss units at 200. Although the brilliance of the state of the art C3C4, holographic-receiving layer is higher than 130 gloss units, applicants have achieved a marked improvement thereover by discovering the usability of COC as a hologram-receiving layer in a holographic film structure.

In accordance with the broadest aspects of this invention, the gloss of the COC layer at 20°, as measured by ASTM D2457-97 is the range of 140 to 170; more preferably in the range of 145 to 160 and even more preferably in the range of 160 to 170 units. These are the gloss values before the hologram-receiving layer is embossed and, if desired, metallized. However, it should be understood that the high gloss of the non-embossed, non-metallized surface translates to enhanced brilliance (e.g., crispness and clarity) of the micro-embossed image either in metallized or non-metallized holographic films of this invention.

The micro-embossing and, if desired, the metallizing operation are conducted off-line, after the multilayer coextruded biaxially oriented film has been formed in a conventional co-extrusion process. Specifically, the unembossed, non-metallized films of this invention are packaged in a roll form and are then unwound and directed through a pre-heating station prior to being directed through an embossing nip, including a rubber back-up roll, and a cooled, embossing tool with the desired holographic pattern etched therein. The cooled embossing roll both imparts and sets the etched pattern in the film surface. If the micro-embossed film is intended to be metallized, the surface of the film for receiving the holographic image thereon preferably (but not necessarily) is treated oxidatively e.g., corona treated, flame treated, or plasma treated, to enhance metal adhesion properties to that surface. Most preferably this treatment is carried out after the embossing operation, so as to preclude the film from sticking to the embossing roll during the embossing operation. After the embossing operation, the embossed surface is metallized, e.g., by vacuum metallization, to thereby apply a thin metal layer that conforms to the surface of the film that includes the holographic micro-embossed image therein. It should be understood that the metal deposition step is carried out to provide an extremely thin metal layer having a thickness that is measured in Angstroms, as is well known to those skilled in the art. Most preferably the metal layer has a thickness in the range of 50 Angstroms to approximately 500 Angstroms and the metal employed in the film can be any of the well known metals that have been employed for this purpose, including aluminum, gold, silver, etc., with the most preferred metal being aluminum. As noted above, the holographic films of this invention can also include other vapor deposited materials, such as a clear metal oxide or a highly refractive zinc sulfide layer.

In the most preferred embodiments of this invention, a metallized layer is included as part of the holographic film and is permanently adhered to the film to form a metallized packaging film having a highly desirable surface appearance and being characterized by a good resistance to the passage of oxygen and water vapor therethrough, without regard to the thickness of the film. These oxygen and water vapor transmission properties are particularly important for packaging and wrapping food products that tend to lose freshness rapidly when exposed to air and/or water vapor.

The metallized holographic films of this invention also are very desirable for use as a decorative component in non-flexible packages, or rigid packages, e.g., packages for tubes of tooth paste, cereal boxes, detergent boxes, etc. In these latter applications, the flexible holographic films of this invention are bonded to either a semi-rigid or rigid substrate, such as a paperboard stock.

Although the most preferred embodiments of this inventions are holographic films with a metallized layer that conforms to the micro-embossed pattern and that remains a permanent component of the film, it is believed that by the addition of suitable release additives the films can be modified to permit transfer of the metal layer, with the embossed pattern imparted thereto, from the holographic films to a second substrate, such as thin tissue paper, a foil substrate, a board stock, or other desired substrates. Suitable release additives are known to the trade and include components such as glycerol monostearate (GMS) and ethoxylated stearylamine. Representative holographic transfer films are disclosed in International Publication No. WO 01/10654, covering a joint invention of Michael D. Butler and Shailesh Chunilal Patel. Although the types and amounts of anti-static/release additives may be varied, for the packaging of foods these additives must meet applicable FDA requirements. As noted earlier, non-metallized holographic films also are within the scope of this invention.

Although the most preferred films of this invention are transparent, opaque films also are within the scope of the broadest aspects of this invention. As is noted in the art, opaque films can include a voiding material, such as calcium carbonate, in the core to form such films. Alternately, opaque films can be formed by providing a pigmented, non-voided core. Reference to an "opaque film" throughout this application includes films that are rendered opaque by the addition of voiding additives as well as films that are rendered opaque by the inclusion of a pigment in the structure. Other than the addition of a voiding additive or pigment to the core, the opaque films of this invention can be of the same composition and construction as the transparent holographic films of this invention described in detail earlier herein.

Although it is believed that opaque films within the scope of this invention will have a lower gloss, lower clarity and higher haze than the transparent films of this invention, it is believed that the gloss still will be better than in opaque holographic films employing prior art polymers as the hologram-receiving layer, such as Ziegler-Natta catalyzed isotactic propylene-ethylene copolymers, or a butene-propylene random copolymer as the micro-embossing layer. This should translate to a brighter opaque holographic film wherein the micro-embossed holographic image therein is sharper and crisper than holographic images in opaque holographic films employing prior art compositions as the hologram-receiving layer.

Without further elaboration, the foregoing will so fully illustrate my invention that others may by applying current or future knowledge; readily adopt the same for use under various conditions of service.

What is claimed is:

1. A multilayer micro-embossed film including a first layer and a micro-embossed layer on at least one side of the first layer, said micro-embossed layer including a holographic image on an outer surface thereof and an additional layer on said outer surface of said micro-embossed layer, said additional layer being from the group consisting of a metal layer, a metal oxide layer and a zinc sulfide layer, said micro-embossed layer including as the primary polymer component, by weight, a cyclic olefin copolymer.

2. The film of claim 1, wherein said additional layer is a metal layer on the micro-embossed layer.

3. The film of claim 2, wherein the metal layer is transferable to another substrate.

4. The film of claim 2, wherein the metal layer is permanently retained as part of the film structure and is not transferable to another substrate.

5. The film of claim 1, wherein the cyclic olefin copolymer is substantially 100% of the polymer component of said embossed layer.

6. The film of claim 2, wherein the cyclic olefin copolymer is substantially 100% of the polymer component of said layer.

7. The film of claim 1, wherein said cyclic olefin copolymer is an ethylene cyclic copolymer.

8. The film of claim 2, wherein said cyclic olefin copolymer is an ethylene cyclic copolymer.

9. The film of claim 1, wherein said micro-embossed layer is adhered directly to said first layer.

10. The film of claim 2, wherein said micro-embossed layer is adhered directly to said first layer.

11. The film of claim 1, wherein said micro-embossed layer is on one side of the first layer and a heat sealable layer is on the side of the first layer opposite said one side.

12. The film of claim 1, wherein said micro-embossed layer is on one side of the first layer and a printable layer is on the side of the first layer opposite said one side.

13. The film of claim 1, wherein said cyclic olefin copolymer is a copolymer of ethylene and norbornene.

14. The film of claim 2, wherein said cyclic olefin copolymer is a copolymer of ethylene and norbornene.

15. The film of claim 5, wherein said cyclic olefin copolymer is a copolymer of ethylene and norbornene.

16. The film of claim 6, wherein said cyclic olefin copolymer is a copolymer of ethylene and norbornene.

17. The film of claim 7, wherein said cyclic olefin copolymer is a copolymer of ethylene and norbornene.

18. The film of claim 8, wherein said cyclic olefin copolymer is a copolymer of ethylene and norbornene.

19. A multilayer micro-embossed film including a first layer, a micro-embossed layer on one side of the first layer and a heat sealable layer on the side of the first layer opposite said one side, said micro-embossed layer including a holographic image on an outer surface thereof, said micro-embossed layer including as the primary polymer component, by weight, a cyclic olefin copolymer.

20. A multilayer micro-embossed film including a first layer, a micro-embossed layer on one side of the first layer and a printable layer on the side of the first layer opposite said one side, said micro-embossed layer including a holographic image on an outer surface thereof, said micro-embossed layer including as the primary polymer component, by weight, a cyclic olefin copolymer.

* * * * *